United States Patent

Buschbeck et al.

[11] Patent Number: 5,874,739
[45] Date of Patent: Feb. 23, 1999

[54] ARRANGEMENT FOR SHADOW-CASTING LITHOGRAPHY

[75] Inventors: Herbert Buschbeck; Alfred Chalupka; Hans Loeschner, all of Vienna; Gerhard Stengl, Wernberg; Herbert Vonach, Klosterneuburg, all of Austria

[73] Assignee: Ims-Ionen Mikrofabrikations Systems BMGH, Austria

[21] Appl. No.: 914,070

[22] Filed: Aug. 18, 1997

[30] Foreign Application Priority Data

Aug. 20, 1996 [AT] Austria ..................... 1497/96

[51] Int. Cl.⁶ ............................................. H01J 37/317
[52] U.S. Cl. ................................. 250/396 R; 250/492.2
[58] Field of Search ........................... 250/492.22, 492.2, 250/398, 396 R

[56] References Cited

U.S. PATENT DOCUMENTS 5,742,062  4/1998  Stengl et al. ................. 250/396 R

*Primary Examiner*—Kiet T. Nguyen
*Attorney, Agent, or Firm*—Thomas R. Vigil

[57] ABSTRACT

An arrangement for shadow-casting lithography by focusing electrically charged particles for the purpose of imaging structures of a mask on a substrate disposed immediately to the rear thereof, comprising a particle source (2) and an extraction system (3) which produces a divergent particle beam issuing from a substantially point-shaped virtual source, and comprising a lens (6) for focusing the divergent particle beam which comprises an electrode arrangement (6a, 6b, 6c, 6d, 6e, 6f, 6g, 6h) which includes at least one electrostatic collector lens (6a to 6f in conjunction with an electrostatic diverging lens (6g, 6h) in order to be able to compensate lens errors of the collector lens in a purposeful manner with respect to lens errors of the diverging lens and to render possible a predeterminable change in the imaging scale. The diverging lens is preferably disposed in the beam direction at a distance to the rear of the collector lens in immediate proximity of the mask in order to be able to use the mask as a grating for the diverging lens.

12 Claims, 9 Drawing Sheets

ARRANGEMENT FOR SHADOW-CASTING LITHOGRAPHY

BACKGROUND OF THE INVENTION

1. Field of the Invention

The present invention relates to an arrangement for shadow-casting lithography by means of electrically charged particles for the purpose of imaging structures of a mask on a substrate disposed immediately to the rear thereof, comprising a substantially point-shaped particle source and an extraction system, which produces a divergent particle beam issuing from a substantially point-shaped virtual source and comprising a means for focusing the divergent particle beam to form an at least almost parallel particle beam for the purpose of illuminating the mask and the substrate.

2. Description of the Prior Art

A lithography system of this type is disclosed for example in U.S. Pat. No. 4,757,208, which describes a system for ion lithography by means of shadow-casting projection, conventionally referred to as MIBL (—Masked Ion Broad Beam Lithography/Masked ion Beam Lithography). In this system a hydrogen or helium ion source is provided with an extraction system which comprises a magnetic sector field for the purpose of mass filtering the particles which are issuing from the source. Located in the beam direction at the rear of the sector field is an electrostatic collector lens which is constructed from two coaxial tubes, which lens collects the particle beam in a so-called crossover to form an image point of the source. This crossover lies in the object-side focal plane of a second collector lens which is likewise constructed from two coaxial tubes and which forms the above mentioned means for focusing the divergent particle beam to form a parallel beam. This parallel beam irradiates a lithography mask which is disposed directly above a substrate so that it is possible to image the structure of the mask directly on this substrate.

A further system of this type is described in the periodical Optik [Optics] Vol. 51, Book 5, in an article entitled "Lithium-ion-beam exposure of PMMA layers without proximity-effect" by R. Speidel and U. Behringer in 1979. In the case of this known system instead of lenses comprising two coaxial tubes, two individual lenses are provided which are formed in each case from three coaxial ring electrodes. The individual lens disposed on the mask or wafer-side forms the means for focusing the divergent particle beam to form a parallel beam.

The solution achievable by means of such a known system is dependent upon several factors, namely upon the energy unsharpness of the particles issuing from the source and upon the virtual source size, i.e. upon the narrowest diameter of the region from which the particles from the source visibly originate. Furthermore, the quality of the imaging is limited by the imaging error of the collector lenses, in particular of the second lens used to produce the parallel beam. If the particle beam is not exactly parallel, or rather is slightly convergent or divergent, in addition the inaccuracy of the distance between the mask and the substrate appears as an imaging error. Further contributory factors are also the deviations from flatness of the substrate or the mask.

The Austrian application A 259/95 of the applicant dated 13.2.1995 describes a special lens assembly for the purpose of producing an almost parallel beam which is characterised by particularly few imaging errors. In the case of this arrangement a plurality of coaxially disposed ring electrodes are provided in sequence and their potentials are such that a constant accelerating field is formed at least in sections within the beam cross-section in the beam direction. If a divergent beam of charged particles is now directed into this accelerating field, then the individual particle paths are deflected, by virtue of the accelerating effect of this field, onto a parabolic path, wherein after travelling over a certain distance an almost parallel beam is produced, which can be used to image structures of a mask onto a substrate.

SUMMARY OF THE INVENTION

It is an object of the present invention to improve an arrangement for shadow-casting lithography of the type mentioned in the introduction to such an extent that the imaging errors are greatly reduced with respect to the known systems. In addition, the image field for the imaging should be as large as possible. Furthermore, it should be possible in the case of the device to be created to change the imaging scale within certain limits in order for example to be able to correct by means of lithography changes in length of the substrate which occur in particular when processing large-area substrates. It is likewise an object of the present invention to provide an arrangement which is comparatively inexpensive to achieve and in addition is characterised by its compactness.

These objects are achieved in the case of an arrangement for shadow-casting lithography in a general manner in that the means for focusing the particle beam comprises an electrode arrangement which includes at least one electrostatic collector lens in conjunction with an electrostatic diverging lens. The diverging lens is preferably disposed in the beam direction at a distance to the rear of the collector lens. The entire arrangement is in the strict sense a single multi-electrode lens, wherein hereinunder the focusing part of the arrangement is referred to as the "collector lens" and the dispersing part is referred to as the "diverging lens". This combination of at least one collector lens and at least one diverging lens renders it possible by virtue of optimizing the potentials available at the individual electrodes to compensate any imaging errors of the higher order of the different lenses with respect to each other, so that the imaging characteristics can be improved. Furthermore, it is possible with a lens combination of this type to focus the beam within a particularly large cross-section so that the particle paths extend almost exactly parallel and, if desired, the imaging characteristics can be changed in a convenient manner such that the particle paths can selectively comprise a precisely predeterminable convergence or divergence, in order to render it possible to reduce or enlarge the imaging of the mask structures onto the substrate. By virtue of the new type of lens arrangement, the length of the arrangement in comparison to known arrangements, inter alia also those which comprise accelerating electrodes, is considerably reduced so that it is possible to achieve an arrangement which is compact, economic with materials and thus in practice inexpensive.

The electrostatic collector lens is preferably achieved in a known manner by means of at least two coaxial ring electrodes, whereas the electrostatic diverging lens, as disclosed inter alia in W95/19637, is achieved by means of one ring electrode and one grating. A particularly advantageous embodiment resides, however, in the fact that the electrostatic collector lens comprises more than three coaxially disposed ring electrodes, of which the first electrode comprises an entrance diaphragm having a point-shaped aperture. This embodiment can be optimized with respect to the best possible imaging characteristics in the case of the most compact structure possible, in that at least two of these ring electrodes are connected to the same potential, so that the intermediate space is to a great extent field-free and in that at least a two more of said electrodes are connected to different potentials which form for the charged particles at least in sections an accelerating field.

A preferred embodiment of the arrangement in accordance with the invention resides in the fact that the electrostatic diverging lens is disposed in the region of the mask and the mask forms the "grating" of the diverging lens, wherein in this case, in contrast to the diverging lens disclosed in WO95/19637, the grating lies in the beam direction at the rear of the ring electrode. As a consequence, it is possible on the one hand to forego the manufacture and installation of a grating electrode and on the other hand any undesired changes in intensity within the beam cross-section caused by the grating electrode can be avoided.

A further improvement to the arrangement with respect to its imaging characteristics can be achieved by virtue of the fact that the mask and the substrate are connected to the same potential, so that the space between the mask and the substrate does not comprise an electrical field. As a consequence the particle beam is not influenced in an undesired manner in this region.

One embodiment of an arrangement in accordance with the invention particularly advantageous in practice, resides in the fact that the point-shaped particle source is an ion source comprising a virtual source point, which comprises an extraction system for ions of predetermined energy and a separation system for separating off undesired ion types. In the case of this embodiment it has proven to be advantageous, if there is provided in the beam path between the source and the electrode arrangement at least one electrostatic collector lens which focuses the divergent particle beam issuing from the point-shaped source to form an image of the source. The divergent particle beam issuing from this image of the source is thus converted by means of the new arrangement of electrodes comprising a collector lens and a diverging lens to form a substantially parallel beam and directed onto the mask.

In the case of a preferred embodiment mentioned earlier, wherein the electrode arrangement comprises an entrance diaphragm, the aperture of the entrance diaphragm of the electrode arrangement is in an advantageous manner not substantially greater than the diameter of the image of the source.

In order to be able to vary the size of the imaged structures within predetermined limits, the field strength both of the collector lens and also of the diverging lens in the case of a particularly advantageous embodiment of the arrangement in accordance with the invention can be varied within predetermined limits, so that the deviation of the particle beam from being parallel changes in the region of the substrate and as a consequence the image of the structures of the mask on the substrate can be enlarged or reduced in defined limits.

Further features and advantages of the invention are evident from the description hereinunder of the invention with reference to the attached drawings.

DESCRIPTION OF PREFERRED EMBODIMENT (S)

Figure 1:
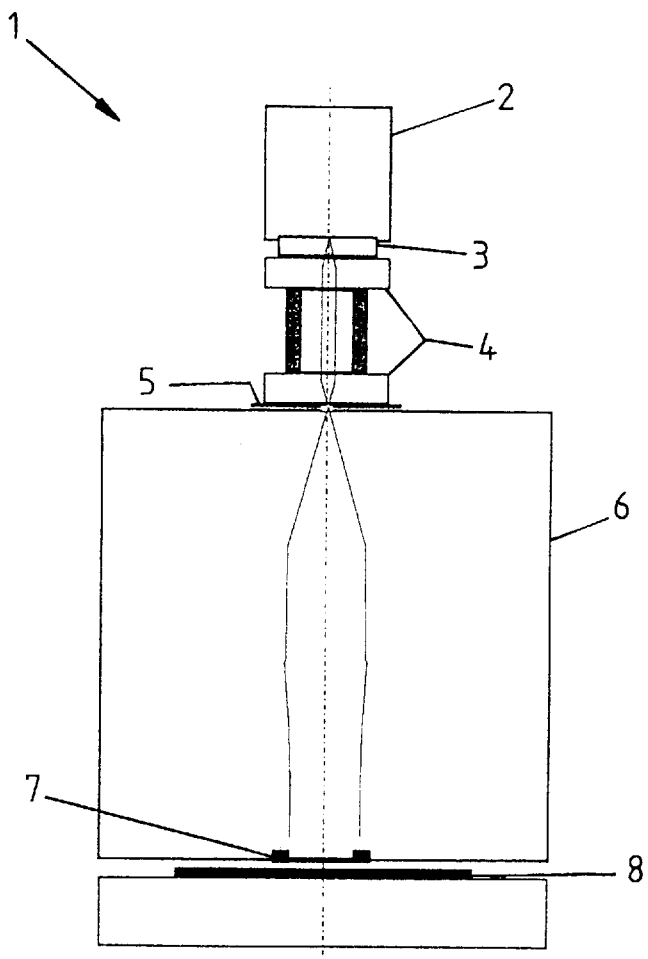
FIG. 1 shows a schematic illustration of the structure of an arrangement in accordance with the invention.

Reference is first made to FIG. 1, which illustrates schematically an exemplified MIBL arrangement 1 of the type in accordance with the invention for the purpose of shadow-casting lithography by means of charged particles (ions).

The arrangement includes a particle source 2 having a smallest possible virtual source size and an extraction system 3, by means of which the particles issuing from the source are accelerated to their initial energy. In order to be able to influence the beam quality, it is advantageous to focus the virtual source point through a system of collector lenses 4, 4' into an image point of the source. In the event that only one particle type is desired, a mass filter (e.g. a Wien filter) can be provided between the lenses 4, 4'.

At the image point of source 2 there is provided an entrance diaphragm 5 for an electrode arrangement 6 which extends in the beam direction from this entrance diaphragm 5 as far as a mask 7 which is disposed directly in front of a substrate 8 in order to image the aperture structures of the mask by means of shadow-casting projection onto the upper-side of the substrate 8.

The electrode arrangement not further illustrated in FIG. 1 comprises in accordance with the invention a combination of at least one electrostatic collector lens having at least one electrostatic diverging lens in order to direct the divergent paths of particle beam issuing from the image of the source in the most error free manner possible and parallel onto the substrate. The collector lens and the diverging lens are disposed at such a distance from each other that no cross-over is formed between them.

A known two electrode lens (Gap lens) or a known three electrode lens (single lens) can for example be used as a collector lens for the purpose of the electrode arrangement in accordance with the present invention. Likewise, combinations of such lenses are also permissible. Electrostatic collector lenses of this type are known from the prior art to the person skilled in the art and are therefore not explained here in detail.

Within the scope of the present invention there is, however, also the possibility of providing a so-called multi-electrode collector lens, which comprises a plurality of, but at least more than three, electrodes. An example for such a lens is further explained hereinunder with reference to FIGS. 3 and 4.

Figure 2:
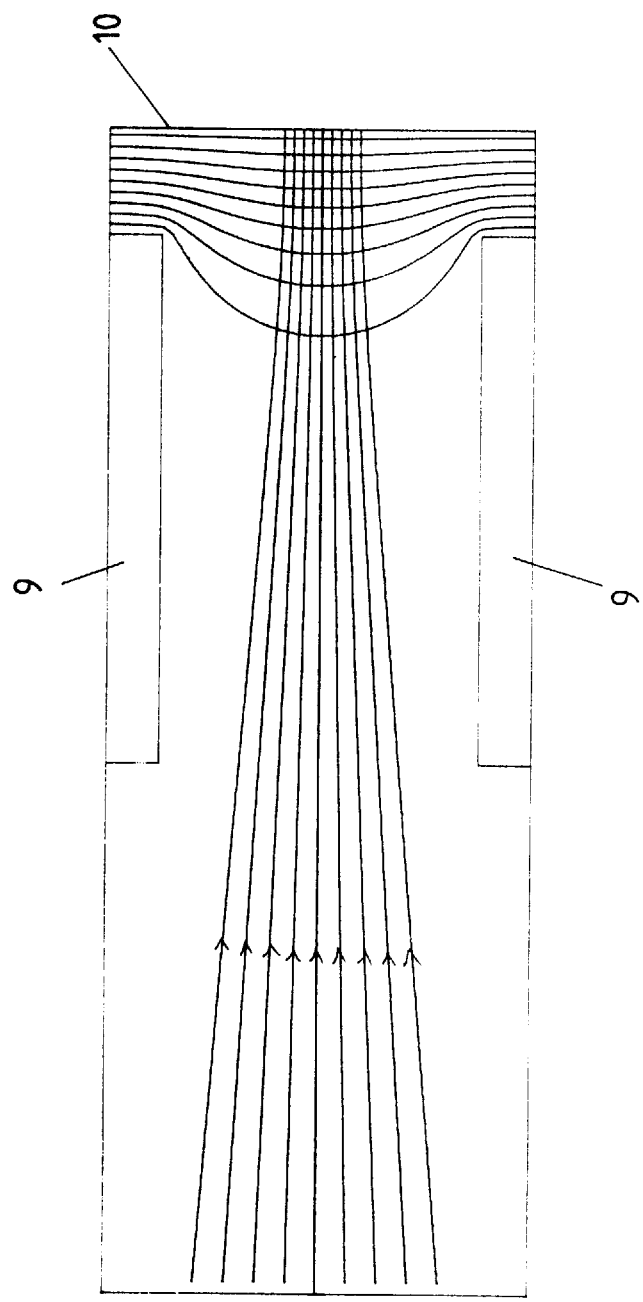
FIG. 2 shows a schematic illustration of the functioning principle of an electrostatic diverging lens.

The functioning principle of electrostatic diverging lenses is illustrated schematically in FIG. 2. Such a lens is conventionally formed by means of a combination of a cylindrical tube 9 or a ring electrode and a plate or a grating 10. The document WO95/19637 mentioned in the introduction discloses an electrostatic diverging lens which in the beam direction first comprises the grating, then the tube electrode; in order for the configuration in accordance with WO95/19637 to have a diverging effect, the electrostatic field must accelerate the particles between the grating and the tube. FIG. 2 shows schematically the arrangement as is preferred for use in the case of the present invention, wherein in the beam direction the tube electrode lies in front of the grating. In FIG. 2, the equipotential lines of the lens field are also illustrated and the density of said lines indicates the size of the electrical field. The defocusing effect of the field is produced in this case, if it concerns a delaying field, in which the field strength is directed substantially against the direction of the arriving particles. The Figure illustrates schematically the paths of particles which arrive converging from the left and are decelerated from 20 keV to 1 keV by means of the imaging lens and in so doing are aligned in parallel.

When using a diverging lens in an arrangement for shadow-casting lithography, the grating can be formed in an advantageous manner by a mask capable of conducting electricity. Within the scope of the present invention it is, however, also possible to dispose a separate grating in the beam path.

Figure 3:
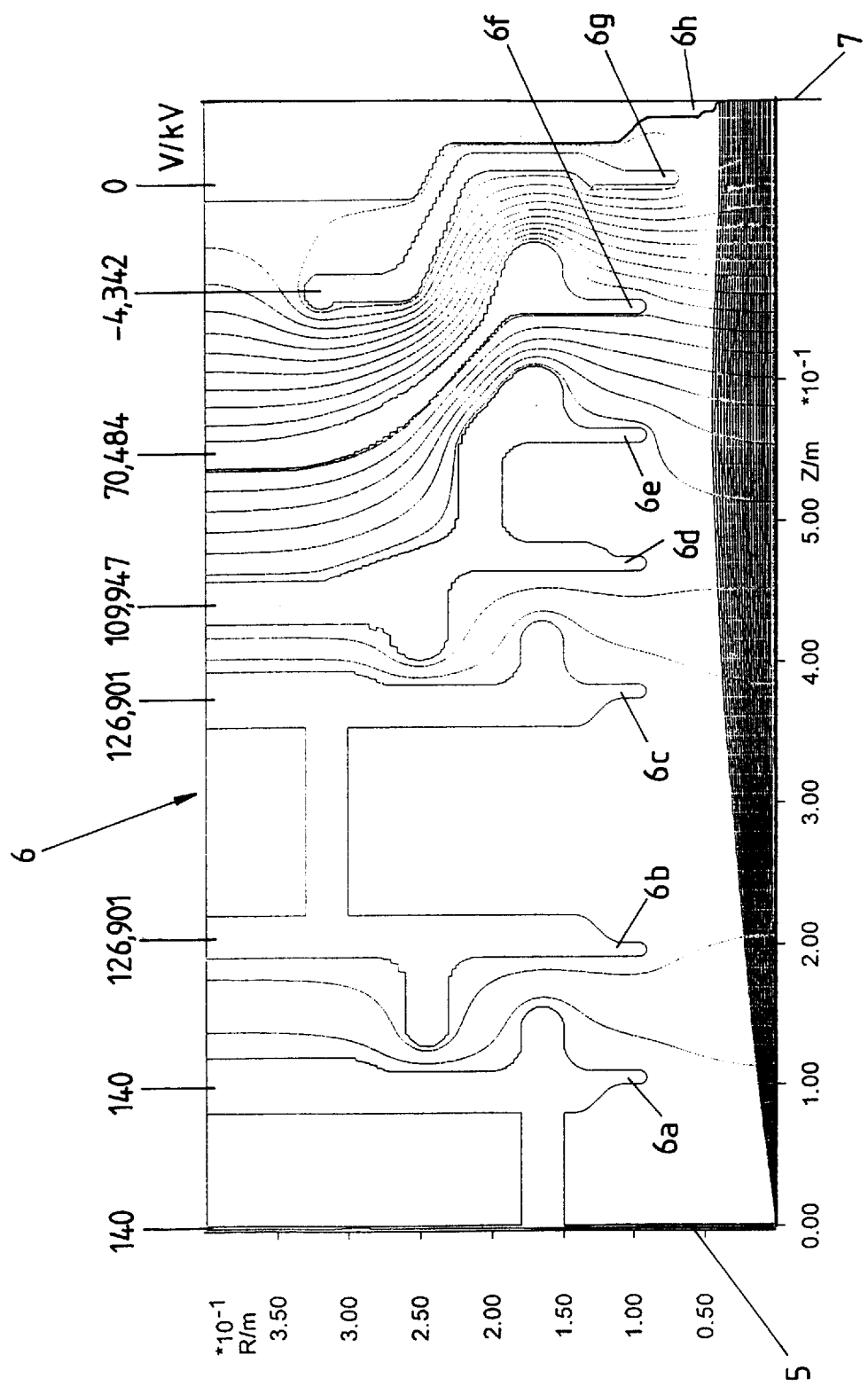
FIG. 3 shows a practical exemplified embodiment for an electrode arrangement.

FIG. 3 illustrates a cross-sectional view of an extremely compact electrode arrangement 6, which has been optimized with respect to the imaging characteristics, for the collector lens and the diverging lens of an arrangement in accordance with the invention, wherein the Z-axis extends in the beam direction along the axis of symmetry of the rotationally symmetrical arrangement and the R-axis indicates the radius of the arrangement. The numeric values indicated on the V-axis represent the potentials connected to the individual electrodes, e.g. for the purpose of imaging with positively charged helium ions.

As already mentioned above, the electrode arrangement comprises an entrance diaphragm 5 having a central aperture which is disposed precisely at the location in which the image of the source is formed by means of the cross-over of the particle beam. The entrance diaphragm 5 is connected to a potential which corresponds precisely to the energy of the particle at the cross-over, in the present case 10 keV. The potential of the entrance diaphragm 5 is therefore at 140 kV, 10 kV lower than that of the source, whose potential is at 150 kV.

In the beam direction at the rear of this entrance diaphragm 5 there is located the electrode arrangement 6 which consists of a plurality of ring-shaped electrodes 6a, 6b, 6c, 6d, 6e, 6f, 6g, 6h for the collector lens and the diverging lens, wherein in the present case the electrodes 6a to 6f can be allocated to the collector lens and the electrodes 6g and 6h together with the schematically illustrated mask 7 can be allocated to the diverging lens.

Figure 4:
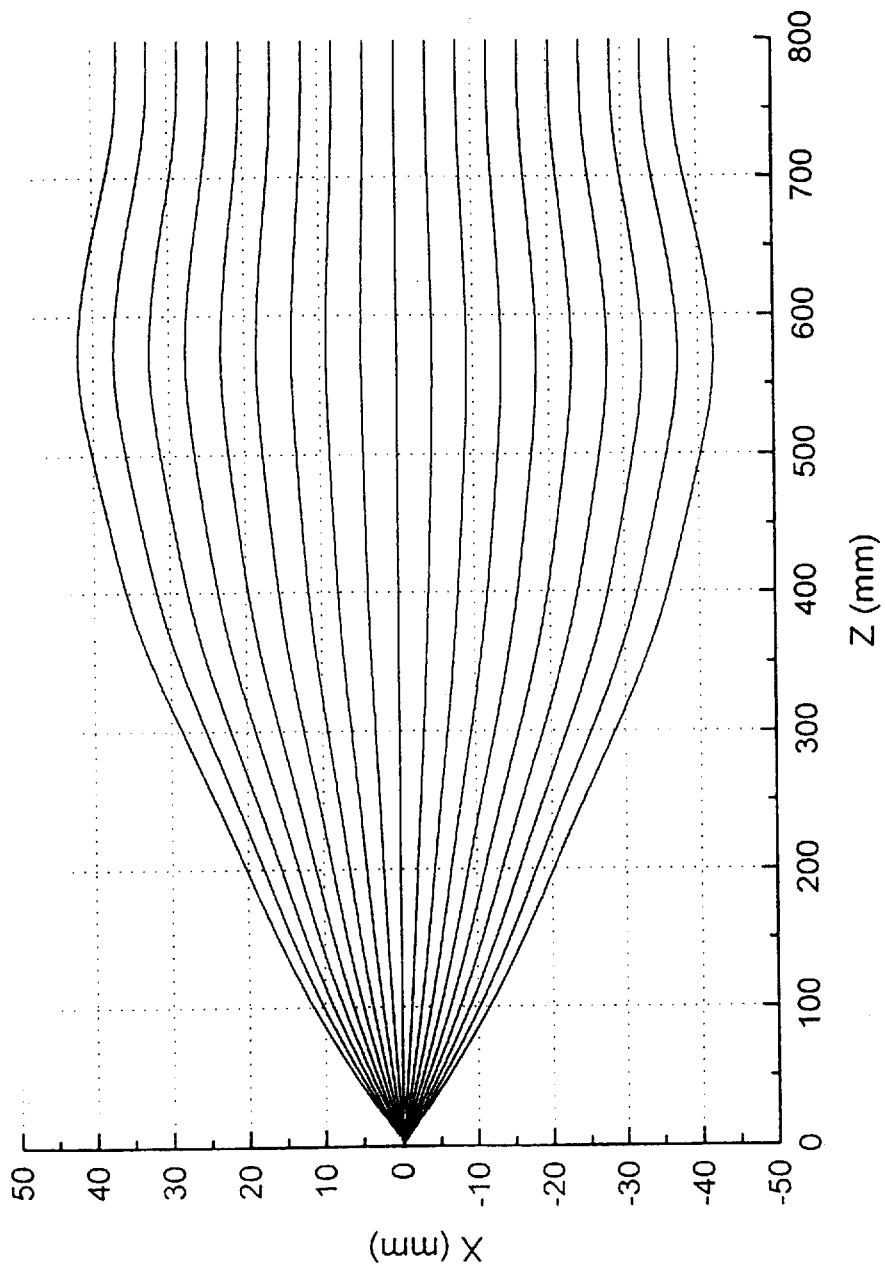
FIG. 4 shows the beam path through the electrode arrangement as shown in FIG. 3.

The electrode arrangement 6a to 6f functioning as the collector lens focuses the particle paths issuing in a divergent manner from the cross-over to form a slightly convergent beam, after which the divergent lens allows this convergent beam to become a parallel beam which is directed to the mask 7. The beam path through the electrode arrangement 6 illustrated in FIG. 3 is illustrated in FIG. 4 in a radially enlarged view.

The exact form of the ring electrodes, their distance from each other and the potentials connected thereto are determined by means of optimizing the electrode arrangement with respect to a structure which is as compact as possible and to the best possible imaging characteristics.

The electrode 6h which is the last electrode of the electrode arrangement 6 in the beam direction is electrically conductively connected to the mask 7 which is likewise capable of conducting electricity and which forms the grating electrode for the diverging lens.

The substrate which is to be illuminated is disposed directly at the rear of the mask (not illustrated in FIG. 3). The distance between the mask and the substrate can be selected in the micrometer or millimetre range depending upon the requirements of the individual application.

It is evident from calculations and first practical experiences that the above described system comprises extraordinary imaging characteristics, in particular also in the case of large area substrates. Possible imaging characteristics of the new system of electrodes are explained in detail hereinunder.

Figure 5:
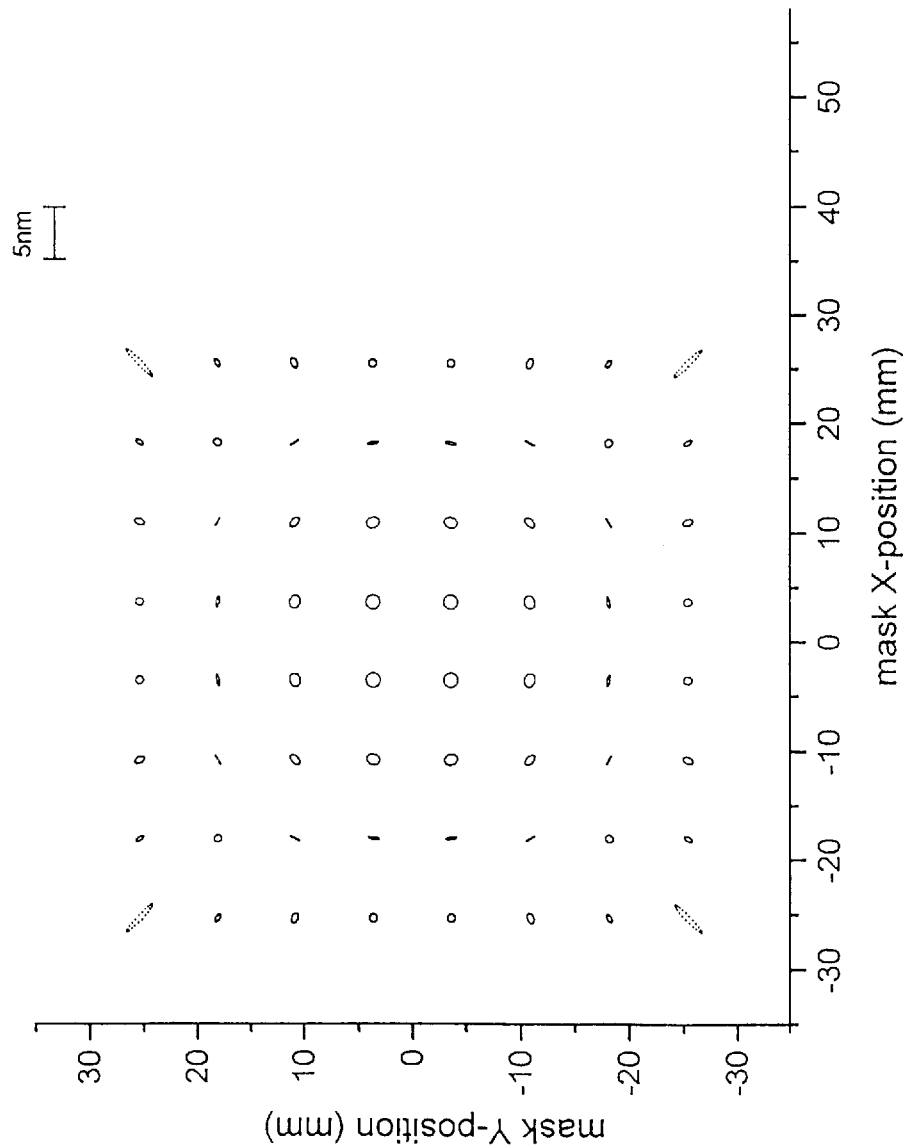
FIG. 5 shows the calculated geometric imaging error of the electrode arrangement as shown in FIG. 3.
Figure 6:
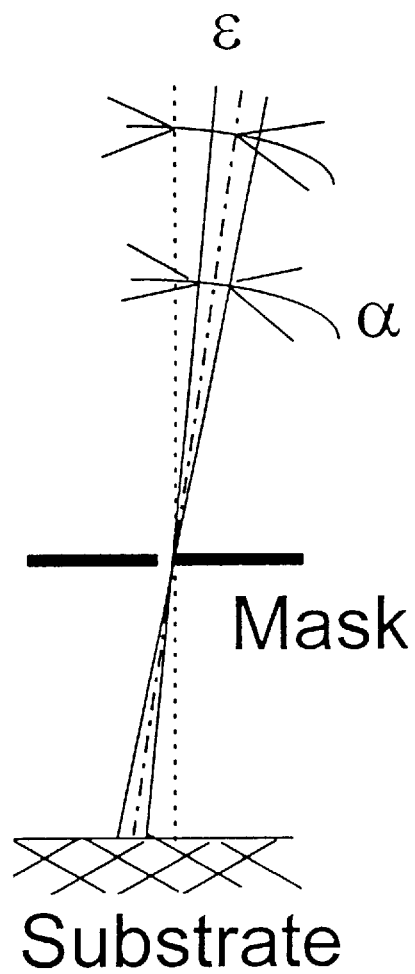
FIG. 6 shows a schematic partial illustration of the mask and of the substrate for the purpose of defining the parameters for the imaging error.

An essential factor with respect to good imaging characteristics is the geometrical imaging error of the imaging system which is predetermined to a great extent by the size of the virtual source. This defines the divergence α of the beam at the mask which is illustrated in FIG. 6. FIG. 5 illustrates the calculations for the geometric imaging error in the case of an image field 50×50 mm in size, wherein the diameter of the particle source was assumed to be 20 μm and the distance between the mask and substrate 300 μm. It is evident from FIG. 5 that the maximum geometric imaging error within the image field is smaller than 5 nm.

In practice it is possible to reduce these parameters even further, for example a particle source having a diameter of 10 μm and a distance of 100 μm between the mask and the substrate, so that the imaging characteristics can likewise be further improved with respect to the geometric error.

Figure 7:
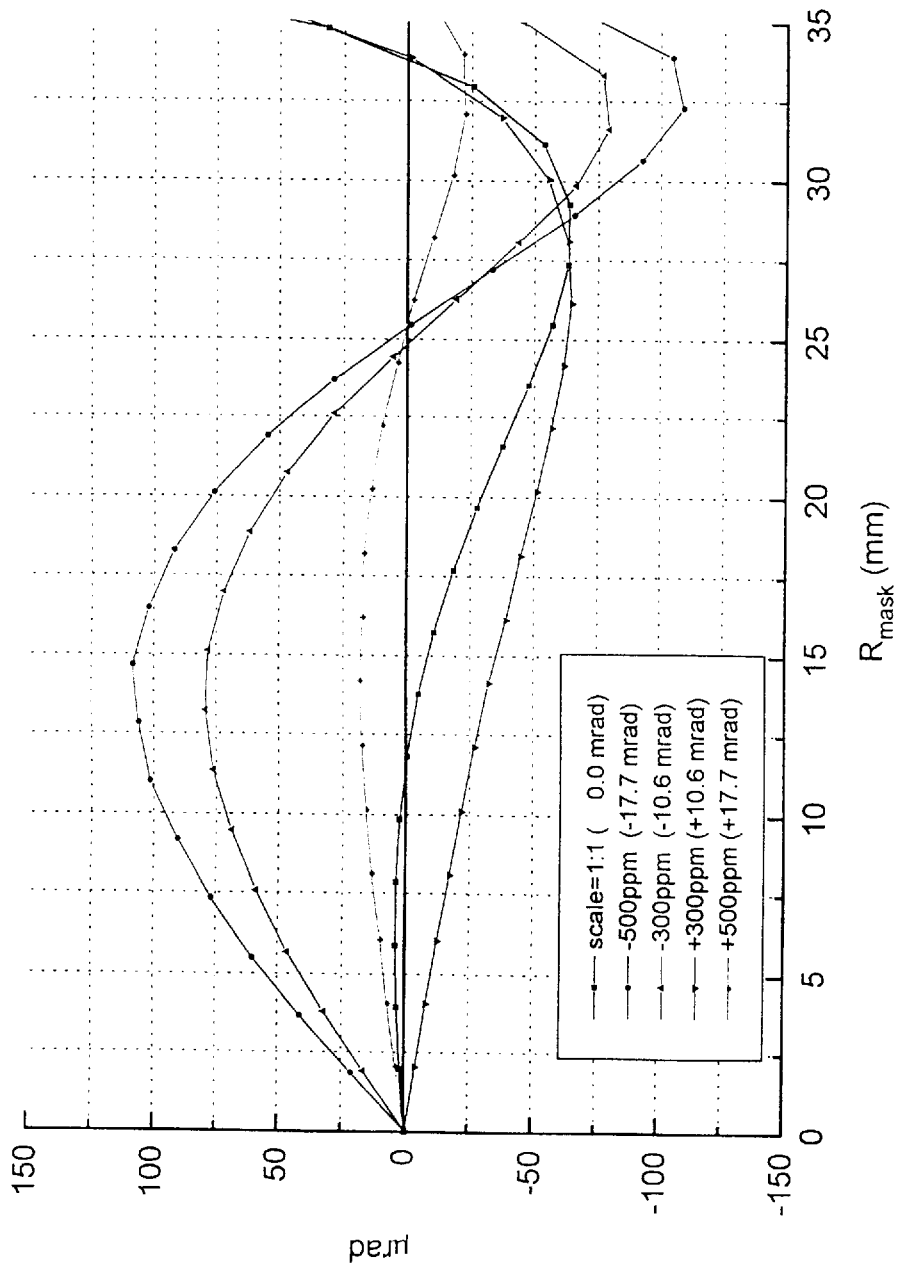
FIG. 7 shows the calculated deviation from the telecentricity within the beam cross-section as shown in FIG. 4 in the case of 1:1 imaging and from the desired beam direction in the case of reduced or enlarged imaging of the mask structures.

A further, essential factor for predetermining the imaging characteristics of the electrode system relates to the deviation of the particle paths from the beam direction (telecentricity), i.e. the quality of the parallelism of the beam upon impinging on the mask. In a purposeful optimizing method, attempts are made to compensate and reverse the imaging errors of the collector lens by means of counterrotating imaging errors of the diverging lens. FIG. 7 illustrates for an image field of 50 mm×50 mm (approximately 35 mm radius) the deviations of the angle of impingement e (as shown in FIG. 6) onto the mask from the optimum angles of impingement, wherein the curve for a precisely parallel beam (imaging scale 1:1) demonstrates a maximum deviation of −60 μrad. This curve corresponds to the beam path illustrated in FIG. 3 and FIG. 4 having the potentials indicated in FIG. 3 for the individual electrodes 6a to 6g of the electrode system 6.

Hereinunder, characteristics of the optimized shadow-casting arrangement, as illustrated in the figures and described above, are summarized in a table with reference to FIG. 6

| | Description | Value: |
|---|---|---|
| a) | Type of ion | He$^+$ |
| b) | Ion energy | max. 150 keV |
| c) | Illuminating time at a 0.5 μC/cm$^2$ photo resist: | ≦5 sec |
| d) | Image field | 50 × 50 mm$^2$ |
| e) | Divergence α of the beam at the mask | ≦30 μrad |
| f) | Deviation ε from the telecentricity | ≦50 μrad |

-continued

| Description | Value: |
|---|---|
| g) X–Y deviation in the case of a change of position of the mask or of the substrate in the Z direction | 0.05 nm/μm |
| h) Distance between the ion source and the substrate plane | approx. 1 m |
| i) Total height of the system | <2 m |

A further advantage of this new type of system resides in the fact that the imaging scale can be varied within predetermined limits, namely quite simply in that by correspondingly changing the potentials at the individual electrodes the effect of the diverging lens in relation to the collector lens is changed. Thus it is possible both to reduce slightly and also enlarge slightly the illustration of the mask structures. This is of great importance particularly in the case of large area substrates, as are used for example for flat viewing screens. By means of technologically necessary tempering steps glass substrates can for example change in size ±150 ppm, in the case of plastic substrates these changes can be greater (=±500 ppm).

In the case of an enlarged or reduced imaging of the mask structures onto the substrate the particle beams are increasingly divergent or convergent in a distance from the beam axis. In the case of a 50 mm×50 mm image field the marginal beams of the particle beam extend for example at a distance of 1 mm between the mask and the substrate and upon enlarging or reducing the image field by 500 ppm below an angle of 17.7 mrad and upon enlarging or reducing the image field by 300 ppm below 10.6 mrad.

FIG. 7 illustrates calculations which demonstrate the deviations of the particle beams from the desired particle path in the case of an image field of 50 mm×50 mm and a change in scale of 300 ppm and 500 ppm. It is evident from these calculations that within the predetermined enlargement/reduction range of ±500 ppm a maximum beam deviation of less than 100 μrad is to be expected. In the case of an assumed distance between the mask and the substrate of 1 mm, the maximum positioning error amounts to 0.1 μm.

It should be noted at this point that in the case of known systems for lithography, changes in scale of the imaging are only possible with acceptable errors approximately within ±75 ppm, so that the new type of system far exceeds such known systems.

Figure 8:
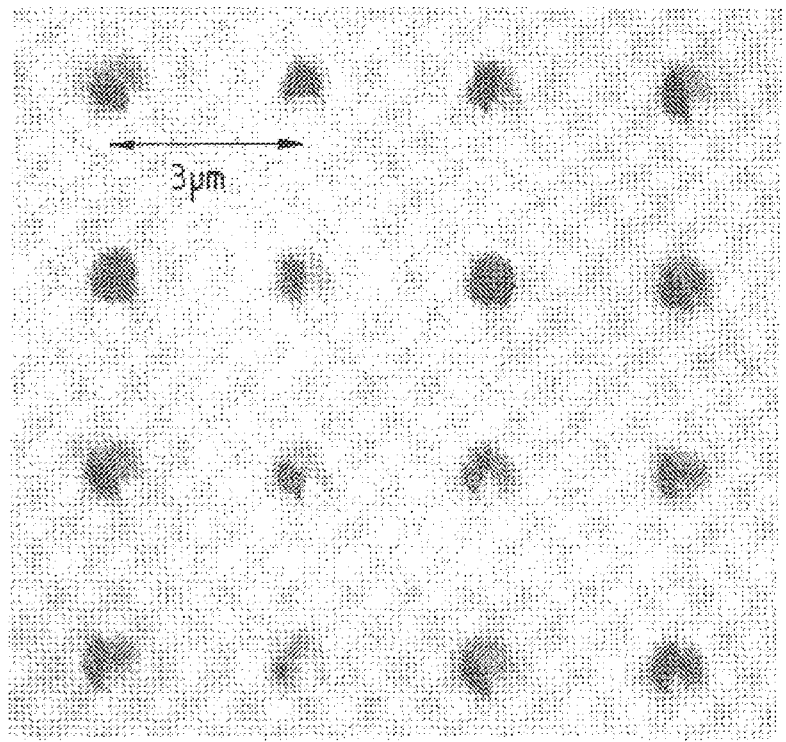
FIG. 8 shows a SEM imaging of mask structures in a partial section of the mask.
Figure 9:
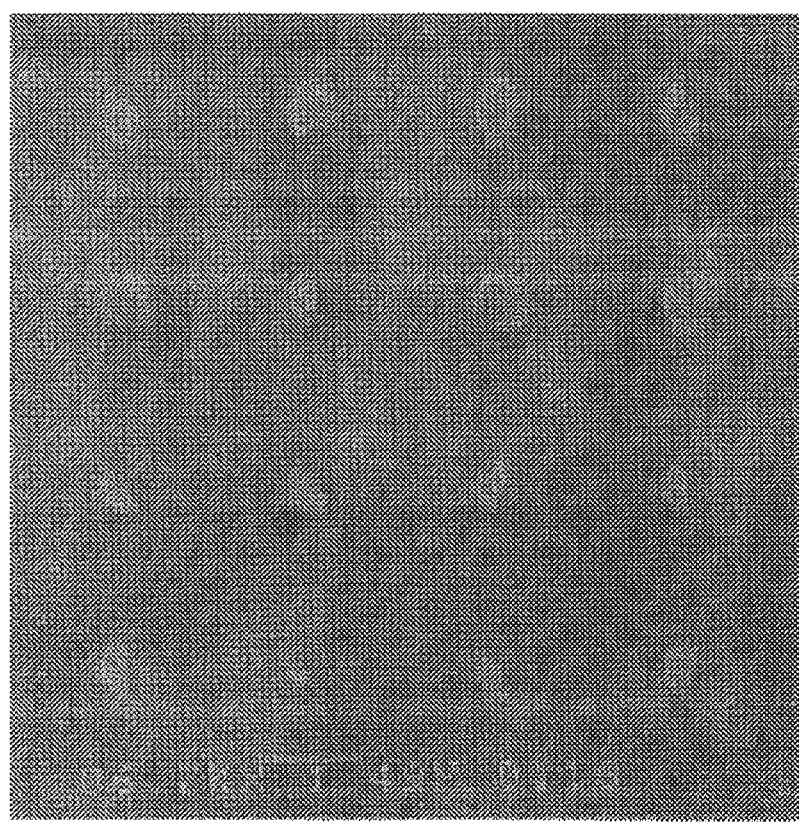
FIG. 9 shows a SEM imaging of the mask structures of FIG. 9 on a substrate.

Tests using an exemplified embodiment produced by the applicant of the arrangement in accordance with the invention in the form of a MIBL system have demonstrated that the parameters listed in the above table can be achieved in practice. FIG. 8 illustrates aperture structures in a mask in a corner of a mask field 60.5 mm×30.3 mm in size. FIG. 9 illustrates a MIBL imaging with 80 keV helium ions in a 0.6 μm thick photoresist (negative photoresist: the photoresist regions illuminated by ions remain after developing). The distance between the mask and the wafer was 1 mm. When carrying out experiments with greater distances (8 mm, 265 mm) it was possible to demonstrate that the divergence α is smaller than 50 μrad. This value is slightly higher than the value of 30 μrad listed in the table owing to the fact that the energy unsharpness of the ion source used was relatively high. It is evident from a comparison of the imaging shown in FIG. 8 and 9 that the structures of the mask within the above mentioned error limits correspond exactly with the structures on the substrate.

Figure 10:
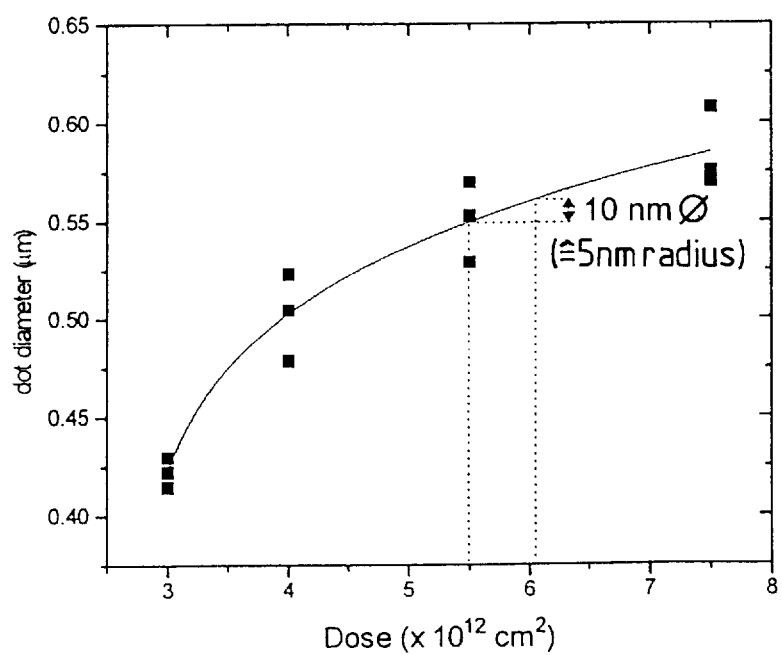
FIG. 10 shows dimensions of the imaged mask structures in dependence upon the irradiation dose.

For the practical use of shadow-casting lithography arrangements, the change of the imaged structures is likewise to be taken into consideration when changing the beam dose. Tests were carried out with the existing system in order to determine the change in the line width when changing the ion dose. The result of these tests is illustrated in FIG. 10.

A comparison is shown hereinunder of the MIBL arrangement achieved in accordance with the present invention using other shadow-casting illuminating systems on the basis of synchroton X-radiation.

| Type of system Size of field | Distance between Mask and substrate | Increase in line width when increasing the dose by 10% | Increase in line width when changing the distance between the mask and substrate |
|---|---|---|---|
| MIBL Field size 60 × 30 mm² | 1000 μm | 5 nm | 0,005 nm/pm |
| X-radiation lithography Field size 25 × 25 mm² | 40 μm 10 μm | 20 nm 10 nm | 0.5 nm/μm 0.0 nm/μm |

Since the present invention is by no way limited to the exemplified embodiment illustrated in the figures and described above, the illuminating field in particular can be increased without any problem to e.g. 100 mm×100 mm.

Some unexpected advantages of the MIBL system in accordance with the invention are thus produced in contrast to the conventional optical lithography. For example, reductions of 1:4 to 1:5 must be carried out in the optical lithography, wherein maximum image diameter of 40 mm could be achieved. The definition of the image in optical systems does not amount to more than 5 μm, whereas in the case of MIBL systems of the type in accordance with the invention it amounts to in excess of 1 mm. As a consequence, in these systems substrates comprising great differences in thickness or surface irregularities can be used and also slight curvatures of the substrate are permissible. In addition to the option mentioned, to change the imaging scale electronically up to approx. 1000 ppm, the MIBL technology also offers the advantage that substantially cheaper photoresists ("g-line" instead of "i-line" photoresists) can be used than in the case of optical systems. Furthermore, when imaging using ions there are no perpendicular waves, therefore it is not necessary to coat the substrate with an anti-reflection agent.

MIBL systems of the type in accordance with the invention open up a wide field of new applications and production methods. In particular, flat viewing screens on the basis of field emission displays are produced at a higher through-put rate. Furthermore, MIBL technology can be used to the optimum extent for producing surface wave filters, microptic components and for micro system engineering.

It is evident to the person skilled in the art that further modifications and optimization of electrode arrangements are possible in order to improve further the imaging characteristics and the compactness and simplicity of the system without abandoning the scope of the present invention.

It follows from this, that included within the scope of the present invention are all shadow-casting arrangements whose electrode arrangement represents a combination of a collector lens and a diverging lens.

We claim:

1. Arrangement for shadow-casting lithography by means of electrically charged particles for the purpose of imaging structures of a mask on a substrate disposed immediately to the rear thereof, comprising a particle source (2) and an extraction system (3) which produces a divergent particle beam issuing from a substantially point-shaped virtual source and comprising means (6) for focusing the divergent particle beam to form an at least almost parallel particle beam for the purpose of illuminating the mask (7) and the substrate (8), characterised in that the means for focusing the particle beam comprises an electrode arrangement (6a, 6b, 6c, 6d, 6e, 6f, 6g, 6h) which includes at least one electrostatic collector lens (6a to 6f) in conjunction with an electrostatic diverging lens (6g, 6h).

2. Arrangement according to claim 1, characterised in that the diverging lens is disposed in the beam direction at a distance to the rear of the collector lens.

3. Arrangement according to claim 1, characterised in that the electrostatic collector lens comprises at least two coaxial ring electrodes (6a, 6b, 6c, 6d, 6e, 6f) disposed in sequence at intervals in the beam direction and the electrostatic diverging lens comprises at least one coaxial ring electrode (6g) and a grating (7) disposed in the beam direction at the rear thereof and normal to the beam direction.

4. Arrangement according to claim 3, characterised in that the electrostatic collector lens (6a to 6f) comprises more than three coaxially disposed ring electrodes (6a, 6b, 6c, 6d, 6e, 6f) of which a first electrode having an entrance diaphragm (5) having an aperture which encompasses the virtual source.

5. Arrangement according to claim 4, characterised in that at least two of these ring electrodes (6b, 6c or 6d, 6e) disposed in sequence in the beam direction are connected to a potential, so that a substantially field-free space or a space with low field intensity is formed between these electrodes and that at least two more of these electrodes (6a, 6b or 6c, 6d, or 6e, 6f) are connected to different potentials, which form at least in sections an accelerating field for the charged particles.

6. Arrangement according to claim 3, characterised in that the electrostatic diverging lens is disposed in the region of the mask (7) and the mask (7) forms the grating of the diverging lens (6g, 6h).

7. Arrangement according to claim 1, characterised in that the mask (7) and the substrate (8) are connected to the same potential, so that the space between the mask (7) and substrate (8) does not comprise an electrical field.

8. Arrangement according to claim 1, characterised in that the particle source is an ion source (2), to which is connected an extraction system (3) for producing a diverging beam which contains ions of a predetermined energy and which issues from a virtual source point and a separation means for separating out ions.

9. Arrangement according to claim 1, characterised in that at least one electrostatic collector lens (4) is provided in the beam path between the source (2) and the electrode arrangement (6), which collector lens focuses the diverging particle beam issuing from the point-shaped virtual source in a cross-over to form an image of the virtual source.

10. Arrangement according to claim 9, characterised in that the collector lens (6a, 6b, 6c, 6d, 6e, 6e) comprises an entrance diaphragm (5) whose aperture is disposed at the image point of the virtual source.

11. Arrangement according to claim 10, characterised in that the aperture of the entrance diaphragm (5) of the electrode arrangement (6) is not substantially greater than the diameter of the image point and that the diaphragm (5) is connected to a potential, which corresponds to the energy of the charged particles at the image point.

12. Arrangement according to claim 1, characterised in that a lens field of the collector lens and the diverging lens is continuously variable by changing within predetermined limits the potentials connected to the electrodes (6a, 6b, 6c, 6d, 6e, 6f, 6g, 6h) so that a slightly diverging or converging particle beam is formed and the structures of the mask (7) are imaged onto the substrate (8) correspondingly enlarged or reduced.

* * * * *

UNITED STATES PATENT AND TRADEMARK OFFICE
CERTIFICATE OF CORRECTION

PATENT NO. : 5,874,739
DATED : February 23, 1999
INVENTOR(S) : Herbert Bushbeck et al.

It is certified that error appears in the above-indentified patent and that said Letters Patent is hereby corrected as shown below:

On the Title Page, correct the Assignee as follows:

Change from:

"Ims-Ionen Mikrofabrikations Systems BMGH"

to:

--Ims-Ionen Mikrofabrikations Systeme, GmbH--.

Signed and Sealed this

Twenty-second Day of May, 2001

Attest:

NICHOLAS P. GODICI

Attesting Officer    Acting Director of the United States Patent and Trademark Office